US006953724B2

United States Patent
Edleman et al.

(10) Patent No.: US 6,953,724 B2
(45) Date of Patent: Oct. 11, 2005

(54) SELF-LIMITED METAL RECESS FOR DEEP TRENCH METAL FILL

(75) Inventors: Nikki L. Edleman, Pawling, NY (US); Richard S. Wise, New Windsor, NY (US)

(73) Assignee: International Business Machines Corporation, Armonk, NY (US)

( * ) Notice: Subject to any disclaimer, the term of this patent is extended or adjusted under 35 U.S.C. 154(b) by 48 days.

(21) Appl. No.: 10/605,362

(22) Filed: Sep. 25, 2003

(65) Prior Publication Data

US 2005/0070064 A1 Mar. 31, 2005

(51) Int. Cl.$^7$ ..................... H01L 21/8242; H01L 21/20
(52) U.S. Cl. ........................ 438/244; 438/387
(58) Field of Search ................. 438/243–249, 438/396–392; 257/301–305

(56) References Cited

U.S. PATENT DOCUMENTS

| | | | |
|---|---|---|---|
| 4,804,636 A | | 2/1989 | Groover, III et al. |
| 4,957,590 A | | 9/1990 | Douglas |
| 4,975,756 A | | 12/1990 | Haken et al. |
| 5,035,768 A | | 7/1991 | Mu et al. |
| 5,283,453 A | * | 2/1994 | Rajeevakumar ............. 257/304 |
| 5,521,114 A | | 5/1996 | Rajeevakumar |
| 5,754,390 A | | 5/1998 | Sandhu et al. |
| 5,948,702 A | | 9/1999 | Rotondaro |
| 6,153,490 A | | 11/2000 | Xing et al. |
| 6,218,255 B1 | * | 4/2001 | Fritzinger et al. ........... 438/386 |
| 6,255,226 B1 | | 7/2001 | Zheng et al. |
| 6,444,542 B2 | | 9/2002 | Moise et al. |
| 6,452,224 B1 | * | 9/2002 | Mandelman et al. ........ 257/296 |
| 6,693,007 B2 | * | 2/2004 | Chen et al. .................. 438/253 |
| 6,750,495 B1 | * | 6/2004 | Alers et al. .................. 257/296 |
| 2002/0009891 A1 | * | 1/2002 | Ting et al. ................... 438/706 |
| 2002/0079522 A1 | * | 6/2002 | Diodato et al. .............. 257/296 |
| 2003/0073282 A1 | * | 4/2003 | Ning .......................... 438/243 |

FOREIGN PATENT DOCUMENTS

JP          2001-15494         1/2001

* cited by examiner

*Primary Examiner*—Jennifer M. Kennedy
(74) *Attorney, Agent, or Firm*—McGinn & Gibb, PLLC; James Cioffi, Esq.

(57) ABSTRACT

Disclosed is a method of manufacturing a deep trench capacitor structure that forms a trench in a substrate, lines the trench with a polysilicon liner, and forms titanium nitride columns along the polysilicon liner. The method etches the titanium nitride columns using chlorine-based dry chemistry that is substantially isotropic. This etching process removes the upper portion of the titanium nitride columns without affecting the polysilicon liner. The etching process attacks only in the uppermost portion of the titanium nitride columns such that, after the etching process is completed, the remaining lower portions of the titanium nitride columns are substantially unaffected by the etching process. Then, the method fills the space between the titanium nitride columns and the upper portion of the trench with additional polysilicon material. The process of filling the space simultaneously forms a polysilicon plug and polysilicon cap.

19 Claims, 4 Drawing Sheets

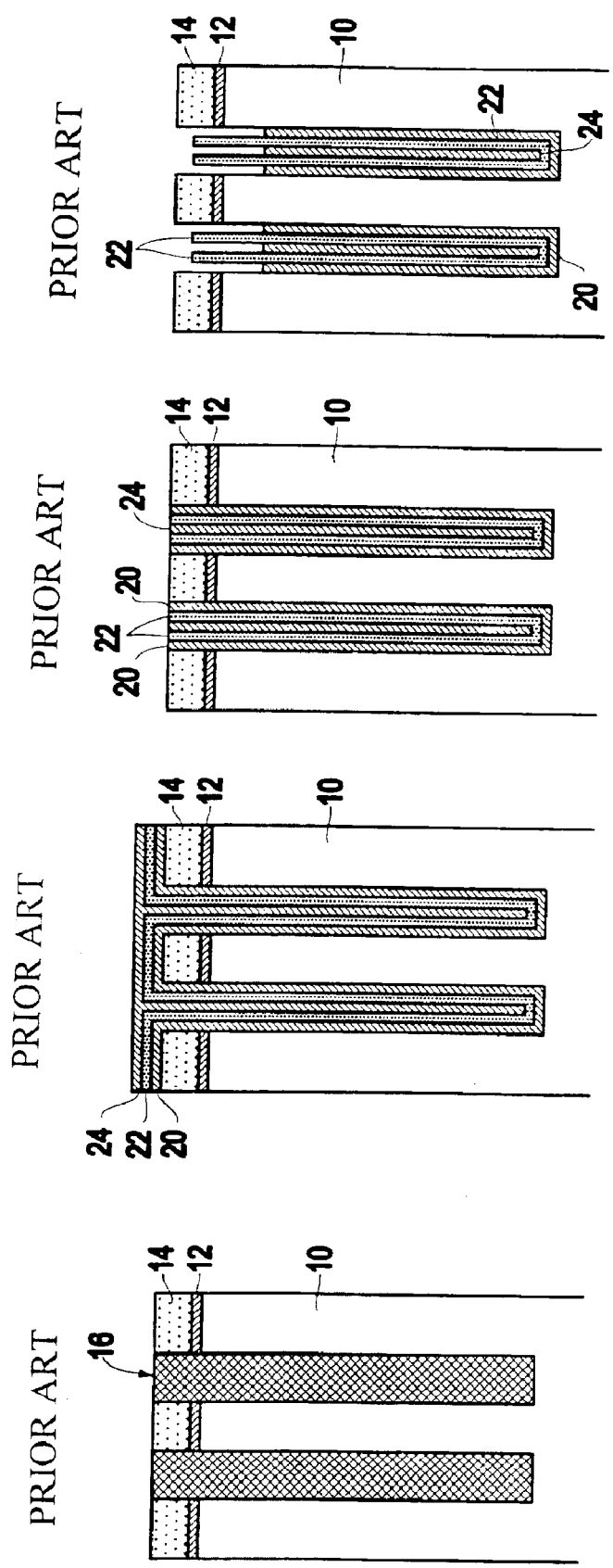

PRIOR ART

US 6,953,724 B2

SELF-LIMITED METAL RECESS FOR DEEP TRENCH METAL FILL

BACKGROUND OF INVENTION

1. Field of the Invention

The present invention generally relates to a process for manufacturing deep trench capacitors and more particularly to an improved etching process that etches titanium nitride trench conductors more effectively than conventional manufacturing methods.

2. Description of the Related Art

In the state of the art semiconductor manufacturing, trench capacitors may be formed to store electrical charge. As the miniaturization of the semiconductor devices progresses, the feature size of the storage trench has correspondingly shrunk. State of the art memory devices today use trenches with opening sizes of less than 120 nm. A large amount of charge must be placed into each trench to compensate for charge leakage out of these trenches. Thus, the retention time of the memory device scales with the total current stored in each trench. Since the opening dimension of these trenches reduces with feature size, the available storage area has historically been increased by increasing the depth of the trench into single crystal silicon. Current state of the art devices require trench depths of 7.5 $\mu$m to allow for adequate charge storage.

SUMMARY OF INVENTION

The invention provides a method of manufacturing a deep trench capacitor structure that forms a trench in a substrate, lines the trench with a polysilicon liner, and forms titanium nitride columns along the polysilicon liner. The invention etches the titanium nitride columns using chlorine-based chemistry that is substantially ion free. This etching process removes the upper portion of the titanium nitride columns without affecting the polysilicon liner. The etching process attacks only in the uppermost portion of the titanium nitride columns such that, after the etching process is completed, the remaining lower portions of the titanium nitride columns are substantially unaffected by the etching process. Then, the invention fills the space between the titanium nitride columns and the upper portion of the trench with additional polysilicon material. The process of filling the space simultaneously forms a polysilicon plug and polysilicon cap.

The chlorine-based chemistry is substantially fluorine free (e.g., has less than 5% fluorine). The etching process uses a decoupled power source that is substantially free of bias (e.g., uses a decoupled power source with a bias power of less than 100 W). Thus, the energetic ion bombardment is extremely low, and the etch rate is primarily (>90%) isotropic. Some low self-bias is present, as required to prevent micro-masking of the etch front and enhanced etch rate.

The etching process is rate-limited by availability of radicals (e.g. Cl, Cl+), due to the low bias highlighted above. Inside the high aspect ratio trench, the diffusivity of these radicals is limited by Knudsen flow, and a gradient in available radicals occurs from the entrance of the trench to the bottom. As the reactive gas in the trench is exposed to TiN, the reaction becomes rate-limited by the local reactant concentration, or mass transfer limited due to the gradient in the trench. Therefore, the invention does not need the polysilicon plug to protect the sides of the titanium nitride columns. Further, by altering the recess etch in this manner, the invention makes the etch more selective to silicon nitride and polysilicon (doped or undoped). By eliminating the polysilicon plug, the invention saves a number of manufacturing process steps.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF DRAWINGS

The invention will be better understood from the following detailed description of preferred embodiments with reference to the drawings, in which:

FIG. 1 is a schematic diagram of a deep trench capacitor;

FIGS. 2A–2F are schematic cross-sectional diagrams of various manufacturing stages of the deep trench capacitor that has a titanium nitride conductor;

DETAILED DESCRIPTION

Figure 2F:
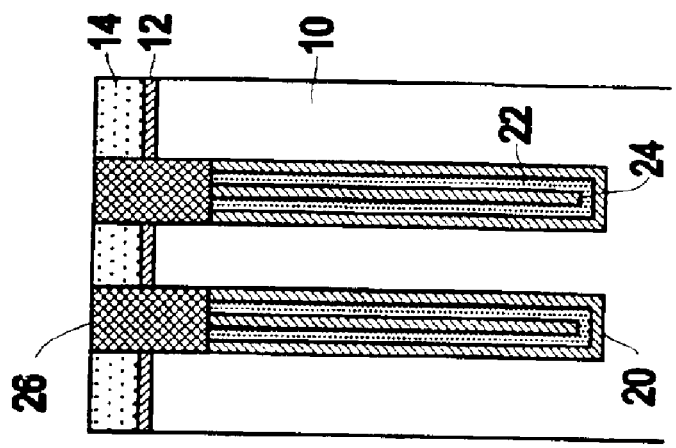

The present invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention.

The decrease in the opening size of the trench with the concurrent increase in trench depth dramatically increases the aspect ratio (defined as depth/opening size) of the trench, increasing the complexity of the trench patterning process. Moreover, as the aspect ratio of the trench increases, the device speed generally increases concurrently, requiring a faster read/write time.

FIG. 1 illustrates a deep trench capacitor formed in a substrate 10, such as a single crystal silicon substrate. The trench conductor 16 is formed within trenches that are usually lined with a node dielectric. To provide additional insulation, these structures include a pad oxide 12 and a pad nitride 14 above the substrate 10.

Many common trenches use doped polysilicon (n-poly) as a conductor. The resistance of the trench conductor to the storage current grows as the inverse square of the trench hydraulic cross section. Due to this inherent growth in resistance, current state of the art devices do not fully charge the available trench surface, and consequently the retention time of the memory device decreases as the size of the trench opening decreases.

In order to overcome the aforementioned limitation in trench conductance, metal fill materials have been employed. The choice of materials is limited by the compatibility with silicon substrate, the ability to conformally deposit in high aspect ratio features, the thermal stability at high temperatures (e.g., 1000 C) typical of FEOL DRAM processes, and the ability to adequately process metals to form capacitor structures. One material, which readily fulfills the first three requirements, is TiN in combination with or without a thin layer (i.e. 150–250 A) of n-poly (here known as the polysilicon liner), which is deposited on the node dielectric prior to TiN deposition. The optional CVD- or LPCVD-deposited polysilicon liner acts as a chemical diffusion barrier and also assists in balancing the work functions on either side of the node dielectric. Current integration schemes for TiN include a full TiN fill option or a partial TiN fill option with n-poly filling the remaining area.

FIGS. 2A–2F are schematic cross-sectional diagrams that illustrates various manufacturing process steps that are performed on deep trench capacitors that utilize titanium nitride conductors. More specifically, FIG. 2A illustrates the substrate 10, pad oxide 12, and pad nitride 14 that are discussed above. In addition, FIG. 2A illustrates the polysilicon liner 20, titanium nitride columns 22, and polysilicon plug 24. FIG. 2B illustrates the structure after it is planarized in, for example, a chemical mechanical polishing (CMP) process. In FIG. 2C, a portion of the polysilicon liner 20 in the polysilicon plug 24 is removed in a selective etching process that attacks only the polysilicon material and leaves the substrate 10, pad oxide 12, pad nitride 14, and titanium nitride columns 22 substantially unaffected.

Figure 2E:
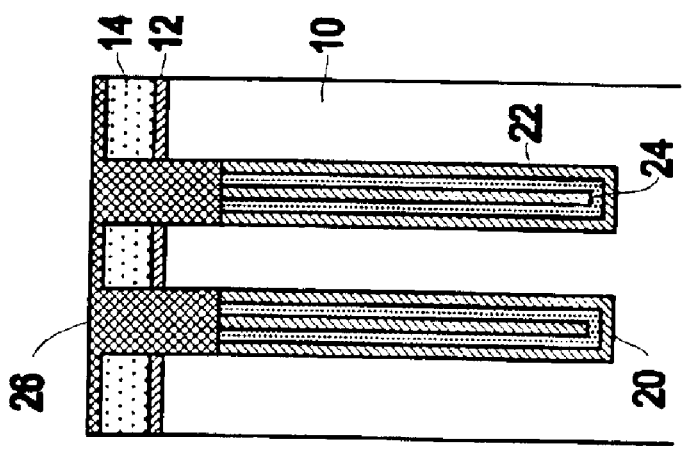
Figure 2D:
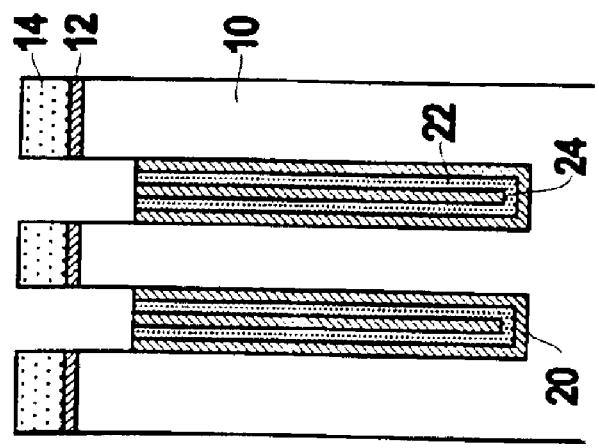

Next, in FIG. 2D, a wet etching process is used to remove the exposed portions of the titanium nitride columns 22. Then, as shown in FIG. 2E, a polysilicon cap 26 is formed in the upper portion of the trench where the polysilicon and titanium nitride were previously removed. Finally, as shown in FIG. 2F, the structure is planarized.

Figure 4:
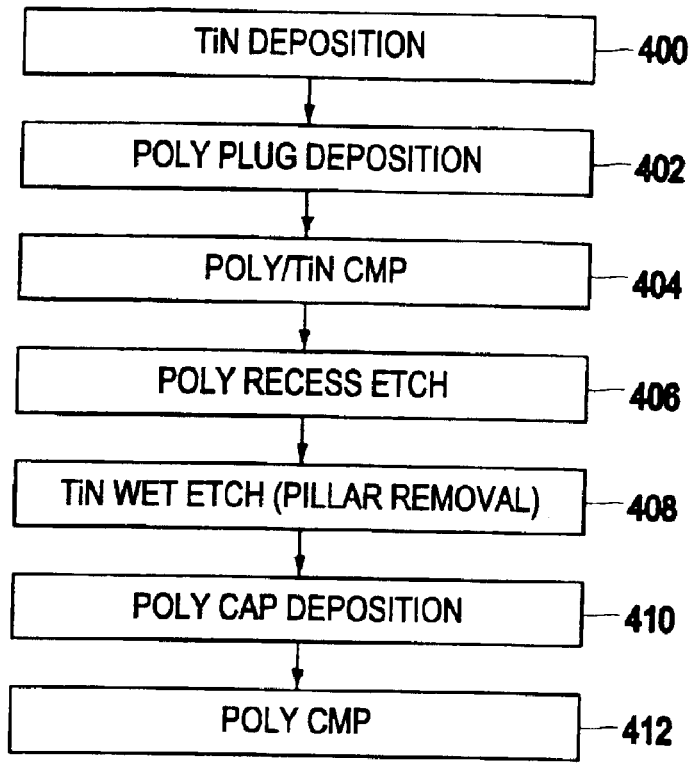
FIG. 4 is a flow diagram of various stages used in manufacturing a deep trench capacitor.
Figure 5:
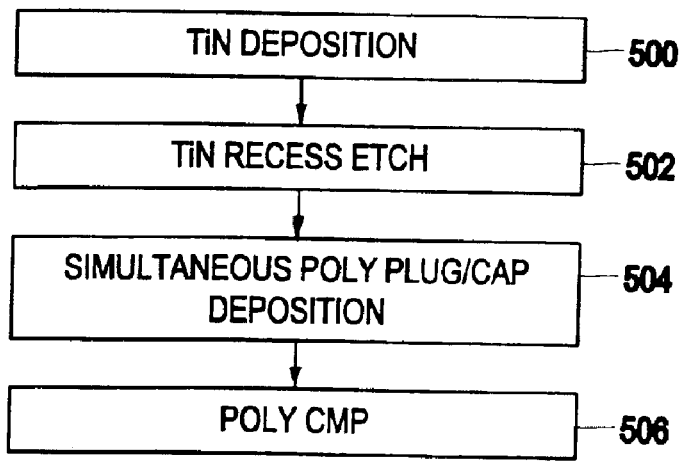
FIG. 5 is a flow diagram of various stages used in manufacturing a deep trench capacitor.

This processing is summarized in flowchart form in FIG. 4. More specifically, in item 400, the titanium nitride 22 is deposited in the deep trench. Then, in item 402, the polysilicon plug 24 is deposited. Next, as shown in FIG. 2B, a chemical mechanical polishing process is performed to planarize the structure (item 404). Then, as shown in FIG. 2C, the recess etch is performed on the polysilicon (item 406). The wet etch shown in FIG. 2D equates with the removal step shown in item 408. Item 410 illustrates the polysilicon cap 26 formation (shown in FIG. 2E) and the planarization process shown in FIG. 2F relates to item 412.

When removing the trench conductor in the top portion of the trench (as shown in FIG. 2D) in order to be effective, this recess etch should only remove material down to the desired depth. For example, 1.5 $\mu$m of material is commonly removed to provide room for gates and wiring to the trench capacitor 22. When n-poly is employed as the trench conductor, this material is readily removed using a standard fluorine-based recess process. This recess etch is required to be selective to the polish stop material on top of the wafer, typically silicon nitride. When TiN is used as the trench conductor, the processing uses a combination of polish (to remove the polysilicon plug 24, TiN 22, and polysilicon liner 20 on the top surface of the wafer, as shown in FIG. 2B, above), followed by polysilicon recess (to remove both polysilicon liner 20 and plug 24 in the trench, as shown in FIG. 2C, above), and then a wet etch to remove remaining pillars of TiN 22 (as shown in FIG. 2D, above). There are many issues with this approach, including cost and complexity (CMP), as well as the risk of particle formation from the remaining TiN pillars following the n-poly recess step.

In theory, a more desirable process flow would be to etch TiN selectively to both n-poly (to preserve the integrity of the node dielectric) as well as the top silicon nitride 14. By first removing the TiN selective to n-poly, the remaining films (n-poly liner, if used) are supported by the trench sidewall and hence particle concerns are mitigated. State of the art etch fluorine based processes (e.g. $SF_6$), for TiN have high selectivity to silicon nitride but low etch rate and low selectivity to n-Poly. State of the art chlorine based metal etch processes (e.g. $Cl_2/BCl_3$) for TiN offer poor selectivity to silicon nitride as well as polysilicon, but offer high TiN etch rates.

In consideration of these issues, the invention provides a method (shown in FIGS. 3A–3D and 5) to recess TiN in the trenches without the need for a polysilicon plug 24 (e.g., a recess etch in which the TiN etch rate is negligible below the depth of the recess). In addition, this method provides high (>100:1) selectivity to both silicon nitride and n-Poly, greatly simplifying the introduction of TiN into the trench nodule and reducing the number of processing steps. This method removes one deposition (the polysilicon plug 24), one CMP (item 404), and one wet etch step (item 408) from the trench top shaping process flow shown in FIGS. 2A–2F and 4.

Figure 3A:
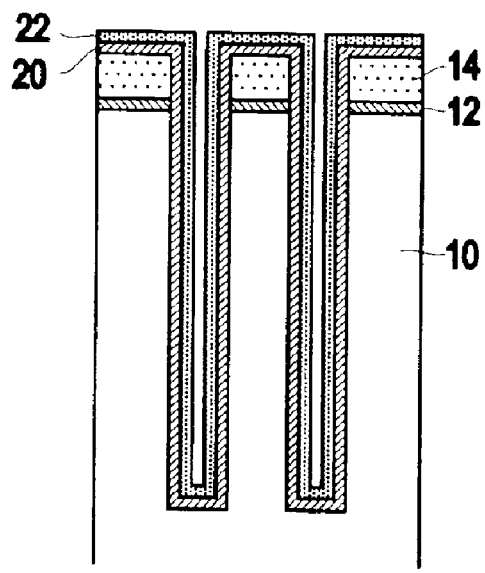
FIGS. 3A–3D are schematic cross-sectional diagrams of various manufacturing stages of the deep trench capacitor that has a titanium nitride conductor.
Figure 3B:
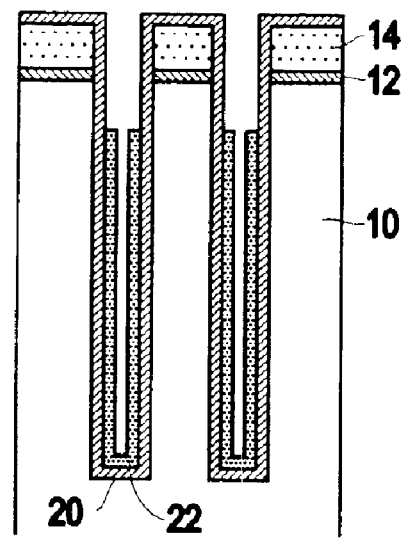
Figure 3C:
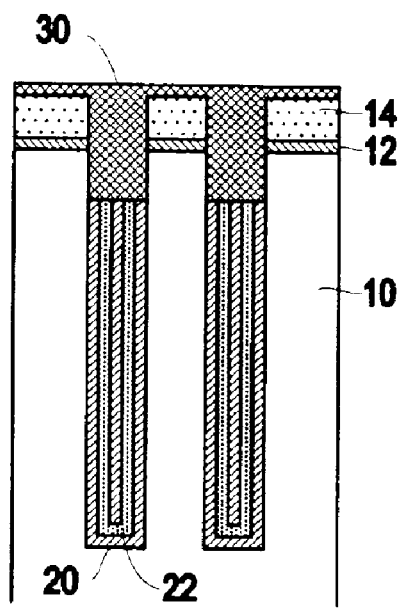
Figure 3D:
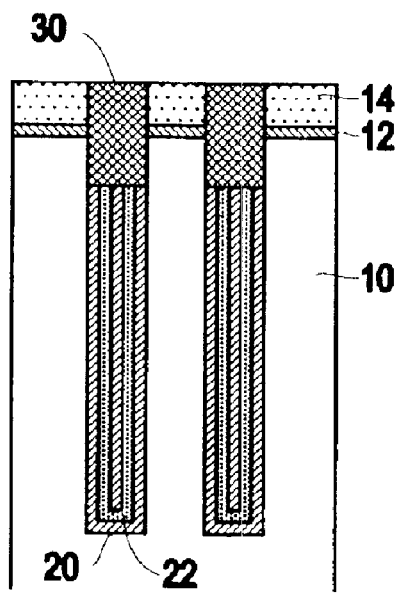

More specifically, as shown in FIGS. 3A–3D (and in FIG. 5) this aspect of the invention begins with the structure shown in FIGS. 3A that has a substrate 10, pad oxide 12, pad nitride 14, and polysilicon liner 20. As shown in item 500 in FIG. 5, the invention deposits a sufficient amount of titanium nitride 22 to form the titanium nitride columns. However, this aspect of the invention does not form the polysilicon plug 24 that is mentioned above. Instead, as shown in item 502 and FIG. 3B, the titanium nitride columns 22 are etched using a chlorine-based etching process that is substantially isotropic due to low incoming ion energy. This etching process removes the upper portion of the titanium nitride columns 22 without affecting the optional polysilicon liner 20. The etching process attacks only in the uppermost portion of the titanium nitride columns 22 such that, after the etching process is completed, the remaining lower portions of the titanium nitride columns are substantially unaffected by the etching process. Therefore, this aspect of the invention dispenses with the need for a polysilicon plug 24. To complete the processing, the invention deposits polysilicon 30, which simultaneously forms the plug and the cap (item 504) as shown in FIG. 3C. Finally, the structure is planarized in item 506 (FIG. 3D).

The chlorine-based chemistry used in the TiN recess etch is substantially fluorine free (e.g., has less than 5% fluorine) and primarily isotropic due to low ion energy. The etching process is rate-limited by availability of radicals (e.g. Cl, Cl+), due to the low bias highlighted above. Inside the high aspect ratio trench the diffusivity of these radicals is limited by Knudsen flow, and a gradient in available radicals occurs from the entrance of the trench to the bottom. As the reactive gas in the trench is exposed to TiN, the reaction becomes rate-limited by the local reactant concentration, or mass transfer limited due to the gradient in the trench. Therefore, the invention does not need the polysilicon plug 24 that was needed above to protect the sides of the titanium nitride columns. Further, by altering the recess etch in this manner, the invention makes the etch more selective to silicon nitride and polysilicon. By eliminating the polysilicon plug, the invention saves a number of costly manufacturing process steps.

More specifically, the etching process only attacks the uppermost surface of the titanium nitride columns because of the strong loading effect of the chlorine radicals. As the recess etch proceeds in the trench, the chlorine radicals are rapidly consumed by available TiN surface. Due to the Knudsen flow regime in the trenches (i.e. collision with trench sidewalls is more probable than gas phase collisions), this consumption of chlorine radicals allows only the top of the TiN metal to be recessed. With this aspect of the invention the etch rate of TiN is a step function with the TiN height, and no erosion of TiN is measurable below the recess level. Again, this avoids the introduction of a polysilicon plug, subsequent CMP steps, and issues with particle formation due to TiN pillars remaining after the poly recess. Furthermore, this effect will increase with increasing trench aspect ratio, so that the inventive process becomes highly scalable.

The etching process shown in item 502 uses a decoupled power source that is substantially free of bias (e.g., uses a decoupled power source with a bias power of less than 100 W). By employing chlorine-based chemistry, the invention provides an adequate etch rate of TiN metal to reduce processing time. By employing chlorine radicals in the absence of ion energy, only low work function materials with many available electrons (e.g. TiN) are etched. In the absence of energetic ion bombardment, the work function of silicon nitride is such that the surface does not provide enough available electrons to allow reaction with chlorine radicals to proceed. Importantly, by using a chlorine-based etch chemistry (rather than the more strongly electronegative F based gases) the etch rate of n-doped polysilicon falls off to near zero, greatly simplifying the process flow. That is to say, fluorine radicals are able to extract electrons (and hence react with) the n-doped polysilicon, whereas the chlorine radicals are not. Neither halogen radical is able to extract electrons from silicon nitride in the absence of energetic ion bombardment. Decoupled gas phase plasma activation of the feedstock materials is used to provide adequate flow of reactive radical s.

Therefore, as described above, this aspect of the invention provides a chlorine-based etch process for TiN in trenches, which provides high selectivity to both silicon (including n-doped polysilicon) and dielectric mask materials (e.g. silicon nitride, silicon dioxide). The etch process uses low DC bias to provide selectivity to the mask material. Typical operating ranges are 1–50 mT pressure, 50–5000 W decoupled source power, less than 100 W bias power to the wafer. The reactive gas feedstocks contain less than 5% fluorine based halogens (e.g. CF4, SF6, NF3, etc.), and the balance Cl2 (Cl2, BCl3, HCl) or Br (HBr, Br2) based reactants. Diluent gases may additionally be added in any range from 0% to 90% of the total feed, and can include He, Ar, N2, Kr, etc.

The chlorine-based chemistry is substantially fluorine free (e.g., has less than 5% fluorine). The etching process uses a decoupled power source that is substantially free of bias (e.g., uses a decoupled power source with a bias power of less than 100 W). Thus, the energetic ion bombardment is extremely low, and the etch rate is primarily (>90%) isotropic. Some low self-bias is present, as required to prevent micro-masking of the etch front and enhanced etch rate.

The etching process is rate-limited by availability of radicals (e.g. Cl, or Cl+), due to the low bias highlighted above. Inside the high aspect ratio trench the diffusivity of these radicals is limited by Knudsen flow, and a gradient in available radicals occurs from the entrance of the trench to the bottom. As the reactive gas in the trench is exposed to TiN, the reaction becomes rate-limited by the local reactant concentration, or mass transfer limited due to the gradient in the trench. Therefore, the invention does not need the polysilicon plug to protect the sides of the titanium nitride columns. Further, by altering the recess etch in this manner, the invention makes the etch more selective to silicon nitride and polysilicon (doped or undoped). By eliminating the polysilicon plug, the invention saves a number of manufacturing process steps.

While the invention has been described in terms of preferred embodiments, those skilled in the art will recognize that the invention can be practiced with modification within the spirit and scope of the appended claims.

What is claimed is:

1. A method of manufacturing a trench capacitor structure, said method comprising:
   forming titanium nitride columns in a trench;
   etching said titanium nitride columns using halogen-based chemistry that is substantially ion free to remove an upper portion of said titanium nitride without protecting sides of said titanium nitride columns, and without affecting surrounding materials, wherein said etching process attacks only in the uppermost portion of said titanium nitride columns, such that, after said etching process is completed, the remaining lower portions of said titanium nitride columns are substantially unaffected by said etching process; and
   filling a space between said titanium nitride columns and said upper portion of said trench with polysilicon material.

2. The method in claim 1, wherein said process of filling said space simultaneously forms a polysilicon plug and polysilicon cap.

3. The method in claim 1, wherein said halogen-based chemistry is substantially fluorine free.

4. The method in claim 1, wherein said halogen-based chemistry has less than 5% fluorine.

5. The method in claim 1, wherein said etching process comprises using a decoupled power source that is substantially free of bias.

6. The method in claim 1, wherein said etching process comprises using a decoupled power source with a bias power of less than 100 W.

7. The method in claim 1, wherein said etching process is substantially isotropic.

8. A method of manufacturing a deep trench capacitor structure, said method comprising:
   forming a trench in a substrate;
   lining said trench with a polysilicon liner;
   forming titanium nitride columns along said polysilicon liner;
   dry etching said titanium nitride columns using halogen-based chemistry that is substantially isotropic to remove an upper portion of said titanium nitride columns, without protecting sides of said titanium nitride without columns, and affecting said polysilicon liner, wherein said etching process attacks only in the uppermost portion of said titanium nitride columns such that, after said etching process is completed, the remaining lower portions of said titanium nitride columns are substantially unaffected by said etching process; and
   filling a space between said titanium nitride columns and said upper portion of said trench with additional polysilicon material.

9. The method in claim 8, wherein said process of filling said space simultaneously forms a polysilicon plug and polysilicon cap.

10. The method in claim 8, wherein said halogen-based chemistry is substantially fluorine free.

11. The method in claim 8, wherein said halogen-based chemistry has less than 5% fluorine.

12. The method in claim 8, wherein said etching process comprises using a decoupled power source that is substantially free of bias.

13. The method in claim 8, wherein said etching process comprises using a decoupled power source with a bias power of less than 100 W.

14. The method in claim 8, wherein said etching process is substantially ion-free.

15. A method of manufacturing a deep trench capacitor structure, said method comprising:

forming a trench in a substrate;

lining said trench with a polysilicon liner;

forming titanium nitride columns along said polysilicon liner;

dry etching said titanium nitride columns using halogen-based chemistry that is substantially ion free to remove an upper portion of said titanium nitride columns without affecting said polysilicon liner and without affecting a remaining lower portion of said titanium nitride columns, wherein said halogen-based chemistry comprises 5%–95% of at least one of chlorine based reactants and bromine-based reactants and less than 5% fluorine-based reactants; and filling a space between said titanium nitride columns and said upper portion of said trench with additional polysilicon material.

16. The method in claim 15, wherein said process of filling said space simultaneously forms a polysilicon plug and polysilicon cap.

17. The method in claim 15, wherein said etching process comprises using a decoupled power source that is substantially free of bias.

18. The method in claim 15, wherein said etching process comprises using a decoupled power source with a bias power of less than 100 W.

19. The method in claim 15, wherein said etching process is substantially isotropic.

* * * * *